United States Patent
Steiner

(10) Patent No.: US 12,381,539 B2
(45) Date of Patent: Aug. 5, 2025

(54) BASELINE RESTORER CIRCUIT

(71) Applicant: ams International AG, Jona (CH)

(72) Inventor: Matthias Steiner, Graz (AT)

(73) Assignee: AMS INTERNATIONAL AG, Jona (CH)

( * ) Notice: Subject to any disclaimer, the term of this patent is extended or adjusted under 35 U.S.C. 154(b) by 116 days.

(21) Appl. No.: 18/554,486

(22) PCT Filed: Apr. 11, 2022

(86) PCT No.: PCT/EP2022/059579
§ 371 (c)(1),
(2) Date: Oct. 9, 2023

(87) PCT Pub. No.: WO2022/218901
PCT Pub. Date: Oct. 20, 2022

(65) Prior Publication Data
US 2024/0195392 A1 Jun. 13, 2024

(30) Foreign Application Priority Data
Apr. 12, 2021 (GB) ...................................... 2105196

(51) Int. Cl.
*H03H 11/12* (2006.01)
*H03F 3/45* (2006.01)

(52) U.S. Cl.
CPC ......... *H03H 11/1217* (2013.01); *H03F 3/456* (2013.01); *H03H 11/1291* (2013.01); *H03F 2200/261* (2013.01); *H03F 2200/471* (2013.01)

(58) Field of Classification Search
CPC ............ H03H 11/1217; H03H 11/1291; H03F 3/456; H03F 2200/261; H03F 2200/471;
(Continued)

(56) References Cited

U.S. PATENT DOCUMENTS 5,675,517 A * 10/1997 Stokdijk ................ G01N 15/14
702/85
2001/0030610 A1 10/2001 Rochelle et al.
(Continued)

FOREIGN PATENT DOCUMENTS

JP H08122442 A 5/1996
JP H08211158 A 8/1996
(Continued)

OTHER PUBLICATIONS

International Search Report issued for the corresponding PCT patent application No. PCT/EP2022/059579, dated Jul. 5, 2022, 4 pages (For informational purposes only).
(Continued)

*Primary Examiner* — Jung Kim
(74) *Attorney, Agent, or Firm* — VIERING, JENTSCHURA & PARTNER mbB

(57) ABSTRACT

A baseline restorer circuit including a controller; a sample control circuit arranged to receive an input voltage signal that is output from a circuit stage comprising an amplifier, and configured to capture a sample of the input voltage signal at a sampling time in response to receiving a control signal from the controller; an analogue processing stage to receive the sample and a constant baseline reference voltage and selectively process the sample to provide an output voltage; a transconductance stage to convert the output voltage to a compensation current and supply the compensation current to an input of the circuit stage; and a change detector to monitor if the input voltage signal changes during a time interval around the sampling time, and if no change is detected in the input voltage signal during the time interval, the controller is configured to control the analogue processing stage to process the sample.

20 Claims, 7 Drawing Sheets

(58) Field of Classification Search
CPC ......... G01T 1/17; G11C 27/02; G11C 27/024; G11C 27/026
See application file for complete search history.

(56) References Cited

U.S. PATENT DOCUMENTS

| | | | |
|---|---|---|---|
| 2004/0027183 | A1 | 2/2004 | Binkley |
| 2016/0301399 | A1 | 10/2016 | Maeding |
| 2016/0377745 | A1 | 12/2016 | Daerr et al. |

FOREIGN PATENT DOCUMENTS

| | | | |
|---|---|---|---|
| JP | 2016540208 | A | 12/2016 |
| WO | 2015078753 | A1 | 6/2015 |

OTHER PUBLICATIONS

Japanese office action issued for the corresponding Japanese patent application No. 2023-556563, dated Oct. 1, 2024, 3 pages (for informational purposes only).

\* cited by examiner

BASELINE RESTORER CIRCUIT

RELATED APPLICATION(S)

This application is a US National Stage Application of International Application PCT/EP2022/059579, filed on 11 Apr. 2022, and claims priority under 35 U.S.C. § 119(a) and 35 U.S.C. § 365(b) from United Kingdom Patent Application GB 2105196.6, filed on 12 Apr. 2021, the contents of which are incorporated herein by reference in their entirety.

TECHNICAL FIELD

The disclosure relates to a baseline restorer circuit for a photon counting system. The disclosure further relates to a photon counting system, and a device for medical diagnostics, comprising the baseline restorer circuit.

BACKGROUND

In a conventional X-ray sensor, an indirect detection principle is used to detect a photon which passes easily through soft tissues of the body of a patient. Indirect detectors comprise a scintillator to convert X-rays to visible light which is captured by a photodetector or photodiode to provide an electrical signal in response to the X-rays impinging on the material of the scintillator.

In a photon counting system, a direct detection principle is used, which allows to detect and count single photon events in order to obtain intensity and spectral information. Whereas in a classical image or X-ray sensor system only the total input intensity is measured, in a photon counting system the photon energy can also be extracted because photons are detected individually.

FIG. 1 shows a block diagram of a photon counting circuit 100, comprising a front-end electronic circuit 104, a photon detector 102, and an energy discriminator 112. The photon detector 102 generates a transient current pulse $I_{det}$ caused by a photon impinging a photosensitive area of the photon detector 102. Detection of single photons is enabled by a special sensor material of the photosensitive area (typically CdTe or CdZnTe for X-ray conversion), which converts photons into current pulses $Id_{et}$. These current pulses $I_{det}$ are received at an input of the front-end electronic circuit 104 and are converted to voltage pulses $V_{sha}$ generated at an output of the front-end electronic circuit 104.

The height of the output voltage peak is proportional to the photon energy, thus containing spectral information. Digitization of the spectral information (output pulse height) can be performed using the energy discriminator 112, for example a flash ADC, which comprises several comparators 114,118 with different thresholds Vth1, ..., VthN−1, VthN. The output signals of the comparators 114,118 are then individually counted by counters 116,120 in order to obtain a spectral distribution.

The static output voltage of the front-end electronic circuit 104 in the absence of current pulses at its input is called a baseline signal $V_{bl}$ and serves as a reference for the discrimination of the pulse heights by the comparators 114,118 of the energy discriminator 112. As a consequence, changes of the baseline have a direct impact on the observed count rate and pulse energy measurement.

FIG. 2 shows an example timing diagram for the photon counting circuit 100 shown in FIG. 1. As shown in FIG. 2, the detector current $I_{det}$ shown by curve 200 exhibits pulses from photons, and from crosstalk to adjacent detector pixels. Additionally, there is an error current $I_{err}$ superimposed from detector leakage and from coupling to the detector biasing. The resulting output voltage $V_{sha}$ of the front-end electronic circuit 104 shown by curve 250 shows voltage pulses riding on a baseline voltage $V_{bl}$. Whenever such a pulse exceeds the comparator thresholds ($V_{th1}$, $V_{th2}$) of the pulse discriminator 112, the pulse is incrementing one or more of the respective counters 116,120.

For this to work accurately, the $I_{err}$ needs to be compensated at the input of the front-end electronic circuit 104 to keep the output of the front-end electronic circuit 104 at a defined baseline voltage $V_{bl,ref}$ during pulse-free moments. Otherwise an error voltage at the output of the front-end electronic circuit 104 would occur, which shifts the pulse train and thus the pulse recognition thresholds ($V_{th1}$, $V_{th2}$) of the pulse discriminator 112.

In the case of a DC path from the input of the front-end electronic circuit 104 to the output of the photon detector 102, leakage current can directly affect baseline stability. The detector idle current needs to be accurately compensated by a "baseline restorer" (BLR) circuit 122. The task of accurately regulating the baseline signal $V_{bl}$ by extracting the baseline from between voltage pulses and by injecting a compensation current $I_{blr}$ is done by the baseline restorer circuit 122.

SUMMARY

The baseline restorer (BLR) needs to contain a voltage monitoring mechanism to extract the baseline voltage $V_{bl}$ between the pulses. This mechanism needs to react fast to be able to capture the short periods of idle time that remain at high pulse densities, and it needs to be precise to keep the baseline voltage $V_{bl}$ well regulated and thus the pulse discriminator decisions accurate.

A photon detector may comprise a matric of pixels (e.g. a matrix of 16×16 pixels). Each pixel of the photo detector may be associated with its own photon counting circuit for counting photons incident on that pixel. A voltage monitor for the BLR which is both fast and accurate is costly in terms of area and power, but the available area is limited because the BLR needs to fit into the area of one detector pixel. Thus an optimal compromise between speed and accuracy versus area is desired.

Additionally, making a voltage monitoring decision based on absolute thresholds as is taught by prior art exposes the system to risks of getting stuck. This is because at startup or during an unexpected charge event e.g. electrostatic discharge (ESD) or a supply glitch, there may be a large deviation between the actual baseline voltage $V_{bl}$ and a desired baseline reference voltage $V_{bl,ref}$ which would cause all subsequent attempts to extract the baseline voltage to fail. Another possible cause of the system getting stuck is a fast change in detector leakage. It is possible to address this by widening up the monitoring tolerance after some time, however this is disadvantageous because it will cause a loss of true baseline during the presence of high pulse influx, because the absolute threshold monitor cannot distinguish between a genuine baseline error referred to above and a temporary deviation due to a pulse.

In general, this disclosure proposes to overcome the above problems.

According to one aspect of the present disclosure there is provided a baseline restorer circuit, the baseline restorer circuit comprising: a controller; a sample control circuit arranged to receive an input voltage signal that is output from a circuit stage comprising an amplifier, wherein the sample control circuit is configured to capture a sample of the input voltage signal at a sampling time in response to receiving a first control signal from the controller; an analogue processing stage arranged to receive the sample of the input voltage signal and a constant baseline reference voltage and selectively process the sample of the input voltage signal to provide an output voltage; a transconductance stage configured to convert the output voltage to a compensation current and supply the compensation current to an input of the circuit stage; and a change detector configured to monitor if the input voltage signal changes during a time interval around the sampling time, and if no change is detected in the input voltage signal during the time interval, the controller is further configured to transmit a second control signal to the analogue processing stage to control the analogue processing stage to process the sample of the input voltage signal.

Thus, the change detector senses the variation of the input voltage signal rather than the absolute difference to a baseline voltage.

Embodiments of the present disclosure advantageously avoid the problem described above of the system getting stuck.

In some implementations, the change detector comprises a change detector stage arranged to continuously receive the input voltage signal.

The commencement and expiry of the time interval may be controlled by the controller transmitting a third control signal to the change detector.

At commencement of the time interval the change detector may be configured to capture an instantaneous value of the input voltage signal and may be configured to monitor if the input voltage signal changes during the time interval by comparing the input voltage signal to said instantaneous value of the input voltage signal.

The change detector may be configured to: determine a voltage difference value based on said comparing; and determine that the input voltage signal has changed during the time interval by at least one of: detecting that the voltage difference value is less than a first negative predetermined threshold voltage; and detecting that the voltage difference value is greater than a second positive predetermined threshold voltage.

In some implementations, the change detector comprises a change detector stage arranged to receive a digital signal output from an energy discriminator, wherein the digital signal is generated by the energy discriminator in dependence on a comparison of a level of the input voltage signal with at least one threshold value, the change detector stage configured to monitor if the input voltage signal changes during a time interval around the sampling time based on the digital signal. This change detector stage may be configured to determine that the input voltage signal has changed during the time interval by detecting a change of state of the digital signal.

Thus in embodiments where the baseline restorer circuit is used in a photon counting circuit, this change detector stage may be used to increase the accuracy of the change detector which comprises a further change detector stage that is arranged to continuously receive the input voltage signal, or this change detector stage may be used as the sole change detector stage of the change detector to reduce the complexity of the change detector and reduce the circuit area incurred by the baseline restorer circuit.

The change detector may be arranged to supply an output signal to the controller, said output signal indicating whether the input voltage signal has changed during the time interval.

If the change detector detects a change in the input voltage signal during the time interval, the controller may be further configured to transmit the second control signal to the analogue processing stage to control the analogue processing stage to discard the sample of the input voltage signal.

In some implementations there is a combination of two monitoring mechanisms, the change detector and a comparator (e.g. a window comparator). Thus some implementations uses a combination of the change detector and the comparator together to efficiently extract (i.e. identify) genuine baseline voltage samples between the pulses at the input voltage signal.

In particular, the baseline restorer circuit may further comprise a comparator arranged to receive a sample of the input voltage signal and the constant baseline reference voltage, the comparator configured to: compare the sample of the input voltage signal to the constant baseline reference voltage to determine a differential voltage value; and determine, using the differential voltage value, whether the sample of the input voltage signal is within an acceptable range of the constant baseline reference voltage; and output a fourth control signal to the processor, the fourth control signal indicating whether the sample of the input voltage signal is within the acceptable range of the constant baseline reference voltage, wherein transmission of the second control signal to the analogue processing stage to control the analogue processing stage to process the sample of the input voltage signal is further based on the fourth control signal indicating that the sample of the input voltage signal is within the acceptable range of the constant baseline reference voltage.

The comparator may be configured to determine that the sample of the input voltage signal is within an acceptable range of the constant baseline reference voltage by at least one of: detecting that the differential voltage value is greater than a third negative predetermined threshold voltage; and detecting that the differential voltage value is less than a fourth positive predetermined threshold voltage. Thus the comparator may be a window comparator.

If the comparator determines that the sample of the input voltage signal is outside of the acceptable range of the constant baseline reference voltage, the controller may be further configured to transmit the second control signal to the analogue processing stage to control the analogue processing stage to discard the sample of the input voltage signal.

This combined monitoring provides a number of advantages:

The speed of the comparator is reflected by the time that it requires after having received the input voltage until it manages to reach the decision at its digital output. The speed of the comparator is influenced by the settling time required by the chain of its internal gain stages. The settling time can be reduced (speed increased) by spending more supply current, and/or by reducing component sizes, and/or by reducing the gain or number of gain stages. The latter two factors degrade accuracy. Inversely, a slower comparator can operate with less supply current, and/or can accept larger components for higher accuracy, and/or can accept larger gain for higher accuracy. In embodiments of the present disclosure, the comparator can be slow because it only needs to operate on a constant (sampled) version of the input voltage signal, and only needs to make one single decision. During the comparator decision time the sample control circuit memorizes the sampled input voltage signal for later usage.

The accuracy of the comparator is dominantly defined by the random offset (sample-to-sample spread). Real comparators would not trip at exactly 0 mV input voltage (or whatever their desired non-zero tripping point is), but exhibit a sample-to-sample variation around the average tripping point. This accuracy is usually specified as a standard deviation value, which could for example be 1.0 mV. In embodiments of the present disclosure, compared to known techniques utilising a stand-alone window comparator (without a change detector), the comparator can be less accurate, because the threshold window can be wider since it does not have to identify the slight onset of an upcoming pulse, or the remaining decay of a previous pulse. The presence of pulses around the sampling instant (the point in time where sampling occurs) are instead recognized by the change detector. That is, for a given BLR decision performance, embodiments of the present disclosure including the change detector require a less accurate comparator (e.g. window comparator) compared to known techniques utilising a stand-alone window comparator (without a change detector).

The allowed wider window comparator range also enables the offset accuracy of the analogue processing stage to be relaxed. Known solutions with a tight window comparator range typically require special offset cancellation techniques at both the window comparator and the analogue processing stage. This is to avoid the BLR circuit stopping from operating due to opposing offsets i.e. the analogue processing stage is regulating its input to its offset voltage, which might not fall into the window comparator range if this range has to be narrow, resulting in the BLR being unable to find baseline samples. Embodiments of the present disclosure advantageously may not require such special offset cancellation techniques.

At high pulse densities, the onset and decay of pulses is not starting to affect the baseline regulation (as long as the pulse peak is large enough to trigger the change detector), i.e. the baseline is more stable at higher pulse rates compared to known solutions involving only absolute threshold monitoring.

The change detector can be less accurate than the comparator, because it has to detect the peak voltages of pulses, in contrast with known solutions involving only absolute threshold monitoring where comparators need to be accurate to the desired baseline precision level.

In some implementations, the controller is further configured to: count a number of samples of the input voltage signal that are discarded only due to the fourth control signal output by the comparator; and if the counted number of samples exceeds a threshold, enter an operating mode in which the controller processes further samples of the input voltage signal in dependence on only the output signal of the change detector.

The controller may be configured to exit said operating mode in response to the fourth control signal indicating that the sample of the input voltage signal is within the acceptable range of the constant baseline reference voltage.

The operating mode enables a large but constant baseline error (deviation between the actual baseline voltage $V_{bl}$ and a desired baseline reference voltage $V_{bl,ref}$) to pass through and be regulated away, allowing the system to recover from an unexpected charge event or at startup. The operating mode is left if the comparator reports a low baseline error again.

The baseline restorer circuit can recover from a large baseline error with this operating mode with little compromise on the high pulse density operation: in this operating mode still all samples with pulses are discarded. This is in contrast to known solutions, where widening up (or removing) the absolute thresholds would lead to samples which are contaminated by pulses being processed as baseline samples, resulting in a wrong baseline regulation in a high pulse density situation.

In some implementations, the sample of the input voltage signal received by the comparator is the sample of the input voltage signal captured by the sample control circuit. Alternatively, the sample of the input voltage signal received by the comparator is captured by a further sample control circuit, the further sample control circuit arranged to receive the input voltage signal that is output from the circuit stage.

The sample control circuit may be arranged to receive the constant baseline reference voltage and be configured to capture a sample of the constant baseline reference voltage, wherein the comparator is arranged to receive the sample of the constant baseline reference voltage.

The further sample control circuit may be arranged to receive the constant baseline reference voltage and may be configured to capture a sample of the constant baseline reference voltage, wherein the comparator is arranged to receive the sample of the constant baseline reference voltage.

The sample control circuit may be arranged to receive the constant baseline reference voltage and be configured to capture a sample of the constant baseline reference voltage, wherein the analogue processing stage is arranged to receive the sample of the constant baseline reference voltage.

A sample control circuit usually introduces a systematic error. By also sampling the constant baseline reference voltage, this advantageously provides better matching. If this error is introduced both at the constant baseline reference voltage and the input voltage signal, then it cancels out from the subtraction operation later on, thus exploiting the benefits of a differential system. This may be desirable for system with higher accuracy demands.

It will be appreciated that in some embodiments, no comparator is present in the baseline restorer circuit. In these implementations the baseline restorer circuit is simplified and incurs less circuit area. Furthermore, the operating mode referred to above (also referred to herein as a recovery mode) is not needed which simplifies the design of the controller.

According to another aspect of the present disclosure there is provided a photon counting circuit, comprising: the baseline restorer circuit described herein; a photon detector having a photon sensitive area, the photon detector being configured to generate a current signal in dependence on an impact of a photon on the photon sensitive area; front-end electronic circuitry to receive the current signal, the circuit stage comprising the amplifier, the circuit stage arranged to receive the current signal and provide the input voltage signal in response to the current signal; and an energy discriminator being connected to the front-end electronic circuitry, the energy discriminator being configured to generate a digital signal in dependence on a comparison of a level of the input voltage signal with at least one threshold value.

According to another aspect of the present disclosure there is provided a device for medical diagnostics, comprising a photon counting circuitry described herein, wherein the device is configured as an X-ray apparatus or a computed tomography scanner.

These and other aspects will be apparent from the embodiments described in the following. The scope of the present disclosure is not intended to be limited by this summary nor to implementations that necessarily solve any or all of the disadvantages noted.

BRIEF DESCRIPTION OF THE DRAWINGS

In the drawings, like reference characters generally refer to the same parts throughout the different views. The drawings are not necessarily to scale, emphasis instead generally being placed upon illustrating the principles disclosed herein. Some embodiments of the disclosure will now be described by way of example only and with reference to the accompanying drawings, in which.

DETAILED DESCRIPTION

Specific embodiments will now be described with reference to the drawings.

Figure 3:
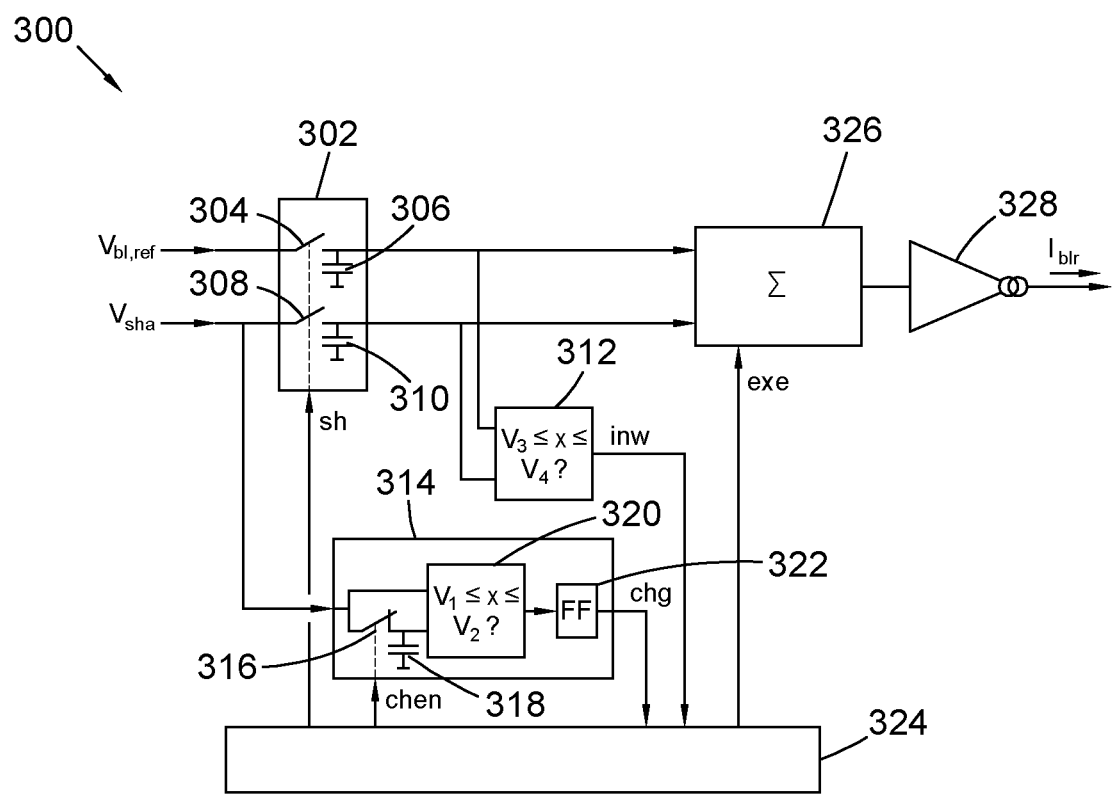
FIG. 3 illustrates a baseline restorer circuit according to an embodiment of the present disclosure.

Reference is first made to FIG. 3 which illustrates a baseline restorer circuit 300 according to one embodiment of the present disclosure.

As shown in FIG. 3, the baseline restorer circuit 300 comprises a sample-and-hold stage 302 (otherwise referred to herein as a sample control circuit), a change detector stage 314, a controller 324, an analogue processing stage 326, and a transconductance stage 328. The baseline restorer circuit 300 may also comprise a comparator 312.

One example implementation of the sample-and-hold stage 302 is shown in FIG. 3. As shown, the sample-and-hold stage 302 is arranged to receive an input voltage signal $V_{sha}$ that is output from a front-end circuit stage 104 of a photon counting circuit.

The sample-and-hold stage 302 is configured to capture a sample of the input voltage signal $V_{sha}$ at a sampling time in response to receiving a control signal (sh) from the controller 324. As shown in FIG. 3, this may be implemented by a switch 308 that is controllable in dependence on the control signal (sh), and a capacitor 310. In particular, when the control signal (sh) is low (e.g. logic 0) the switch 308 is controlled to be open, and when the control signal (sh) is high (e.g. logic 1) the switch 308 is controlled to be closed. When the switch 308 transitions from being closed to open, the sample-and-hold stage 302 captures (e.g. freezes, memorizes) a sample of the input voltage signal $V_{sha}$. The sample-and-hold stage 302 is arranged to supply a captured sample of the input voltage signal $V_{sha}$ to the analogue processing stage 326.

The sample-and-hold stage 302 may also be arranged to receive a desired baseline reference voltage $V_{bl,ref}$. The sample-and-hold stage 302 is configured to capture a sample of the desired baseline reference voltage $V_{bl,ref}$. As shown in FIG. 3, this may be implemented by a switch 304 that is controllable in dependence on the control signal (sh), and a capacitor 306. In particular, when the control signal (sh) is low (e.g. logic 0) the switch 304 is controlled to be open, and when the control signal (sh) is high (e.g. logic 1) the switch 308 is controlled to be closed. When the switch 304 transitions from being closed to open, the sample-and-hold stage 302 captures (e.g. freezes, memorizes) a sample of the desired baseline reference voltage $V_{bl,ref}$. Thus, the sample-and-hold stage 302 may be arranged to supply a captured sample of the desired baseline reference voltage $V_{bl,ref}$ to the analogue processing stage 326.

The sample-and-hold stage 302 may be configured to capture a sample of the desired baseline reference voltage $V_{bl,ref}$ at the same instant as the sampling time of the input voltage signal $V_{sha}$. The sampling of the desired baseline reference voltage $V_{bl,ref}$ does not necessarily need to be at the same instant as the sampling time of the input voltage signal $V_{sha}$. For example, the fact that the $V_{bl,ref}$ is constant and the difference between $V_{sha}$ and $V_{bl,ref}$ is of interest, could be exploited by a switched capacitor sampling network that first captures $V_{bl,ref}$ and then in a second step samples & subtracts $V_{sha}$ in one go.

Alternatively, the sample-and-hold stage 302 may not sample the desired baseline reference voltage $V_{bl,ref}$ and instead the analogue processing stage 326 may receive the desired baseline reference voltage $V_{bl,ref}$ as a continuous non-sampled input.

The change detector stage 314 is arranged to receive the input voltage signal $V_{sha}$ as a continuous non-sampled input.

In response to receiving a control signal (chen) from the controller 324, the change detector stage 314 is configured to capture an instantaneous value of the input voltage signal $V_{sha}$. As shown in FIG. 3, this may be implemented by a switch 316 that is controllable in dependence on the control signal (chen), and a capacitor 318. In particular, when the control signal (chen) is low (e.g. logic 0) the switch 316 is controlled to be closed, and when the control signal (chen) is high (e.g. logic 1) the switch 316 is controlled to be open. When the switch 316 transitions from being closed to open, the change detector stage 314 captures (e.g. freezes, memorizes) a sample of the input voltage signal $V_{sha}$.

The change detector stage 314 is configured to monitor if the input voltage signal $V_{sha}$ changes during a time interval around the sampling time of the input voltage signal $V_{sha}$ performed by the sample-and-hold stage 302. The change detector stage 314 is configured to supply an output signal (chg) to the controller 324, the output signal (chg) indicating whether the input voltage signal $V_{sha}$ has changed during a time interval around the sampling time of the input voltage signal $V_{sha}$ performed by the sample-and-hold stage 302.

The change detector stage 314 comprises a comparator 320 which receives the input voltage signal $V_{sha}$ as a continuous non-sampled input, and the instantaneous value of the input voltage signal $V_{sha}$ captured by the change detector stage 314. The change detector stage 314 is configured to determine a voltage difference value (x) by determining the difference between the input voltage signal $V_{sha}$ and the instantaneous value of the input voltage signal $V_{sha}$ captured by the change detector stage 314.

The comparator 320 shown in FIG. 3 is a window comparator that is configured to determine whether the voltage difference value (x) is within a voltage range defined by V1≤X≤V2.

If the voltage difference value (x) is always within the voltage range defined by the window comparator 320 e.g. that the voltage difference value (x) is greater than a first negative predetermined threshold voltage V1 (e.g. −20 mV) and is less than a second positive predetermined threshold voltage (e.g. +20 mV), then the change detector stage 314 determines that the input voltage signal $V_{sha}$ has not changed during a time interval around the sampling time of the input voltage signal $V_{sha}$ performed by the sample-and-hold stage 302. In this scenario, the comparator 320 never flags a change to the memory element 322, which therefore signals 'no change' to the controller 324 by supplying the output signal (chg) having a low (e.g. logic 0) value to the controller 324. The memory element 322 may for example be a flip-flop or an RS latch.

If the voltage difference value (x) leaves the voltage range defined by the window comparator 320 at least once e.g. that the voltage difference value (x) is less than a first negative predetermined threshold voltage V1 (e.g. −20 mV) or is greater than a second positive predetermined threshold voltage (e.g. +20 mV), then the change detector stage 314 determines that the input voltage signal $V_{sha}$ has changed during a time interval around the sampling time of the input voltage signal $V_{sha}$ performed by the sample-and-hold stage 302. In this scenario, the comparator 320 flags a change one or more times to the memory element 322, which therefore trips and signals 'change' to the controller 324 by supplying the output signal (chg) having a high (e.g. logic 1) value to the controller 324.

Whilst the comparator 320 shown in FIG. 3 is a window comparator, in other implementations the change detector stage 314 comprises a comparator 320 that is sensitive only in one direction.

The controller 324 is configured to transmit a control signal (exe) to the analogue processing stage 326 to control the analogue processing stage 326 to either discard or process the sample of the input voltage signal $V_{sha}$.

The analogue processing stage 326 processes the sample of the input voltage signal $V_{sha}$ when the control signal (exe) received from the controller 324 is high (e.g. logic 1). The analogue processing stage 326 discards the sample of the input voltage signal $V_{sha}$ (does not process it) when the control signal (exe) received from the controller 324 is low (e.g. logic 0).

In embodiments whereby the baseline restorer circuit 300 does not comprise the comparator 312, the value of the control signal (exe) is solely dependent on the output signal (chg) received from the change detector stage 314.

That is, in response to the controller 324 receiving a low output signal (chg) (e.g. logic 0) indicating that the input voltage signal $V_{sha}$ has not changed during a time interval around the sampling time of the input voltage signal $V_{sha}$ performed by the sample-and-hold stage 302, the controller 324 is configured to supply the control signal (exe) having a high (e.g. logic 1) value to allow processing of the sample of the input voltage signal $V_{sha}$. Similarly, in response to the controller 324 receiving a high output signal (chg) (e.g. logic 1) indicating that the input voltage signal $V_{sha}$ has changed during a time interval around the sampling time of the input voltage signal $V_{sha}$ performed by the sample-and-hold stage 302, the controller 324 is configured to supply the control signal (exe) having a low (e.g. logic 0) value to discard the sample of the input voltage signal $V_{sha}$.

The analogue processing stage 326 is arranged to receive the sample of the input voltage signal $V_{sha}$ from the sample-and-hold stage 302. The analogue processing stage 326 is further arranged to receive a sample of the desired baseline reference voltage $V_{bl,ref}$ from the sample-and-hold stage 302 or may receive the desired baseline reference voltage $V_{bl,ref}$ as a continuous non-sampled input. The analogue processing stage 326 also receives the control signal (exe) from the controller 324. The analogue processing stage 326 selectively processes the sample of the input voltage signal $V_{sha}$ to provide an output voltage.

Figure 1:
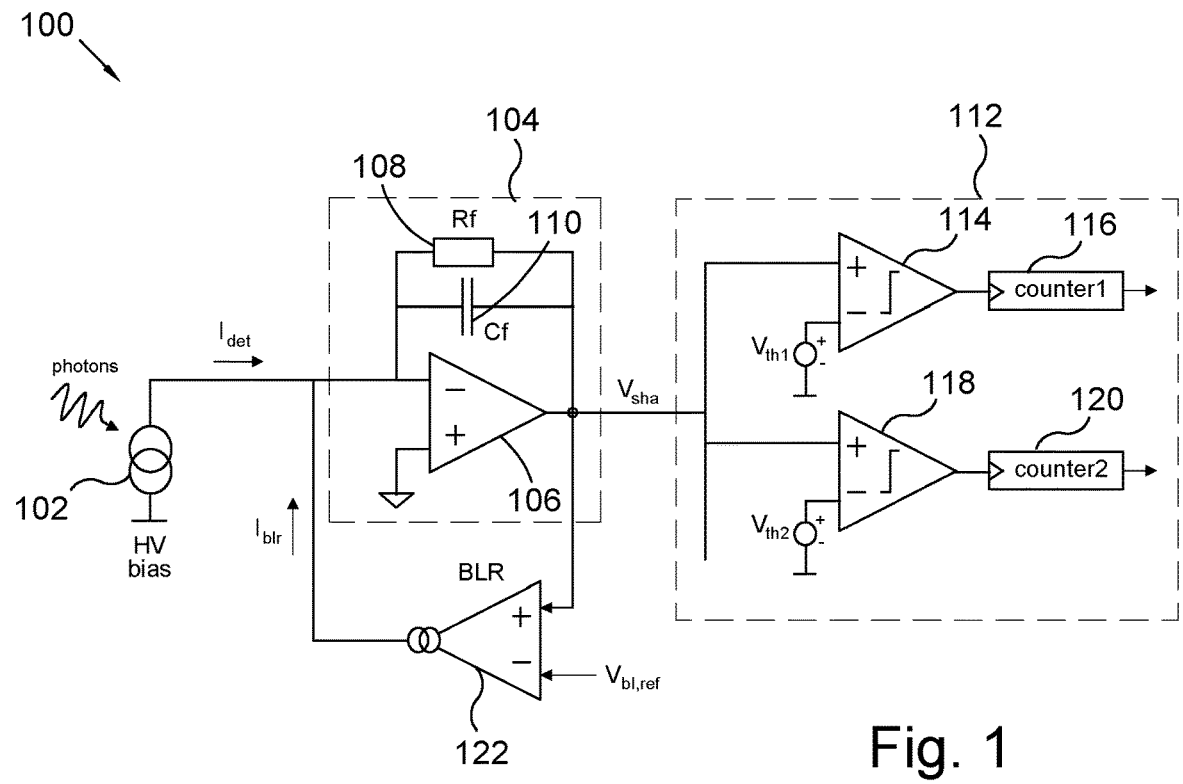
FIG. 1 illustrates a photon counting circuit including a baseline restorer circuit.
Figure 2:
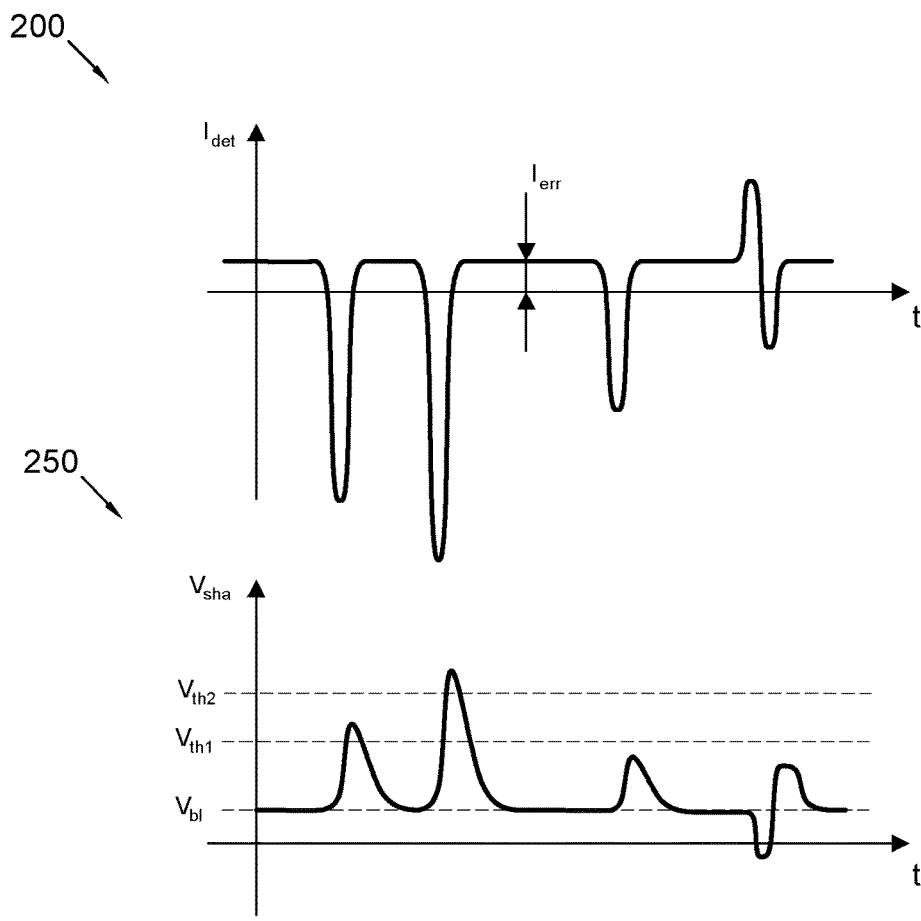
FIG. 2 is an example timing diagram for the photon counting circuit shown in FIG. 1.

The analogue processing stage 326 may be an integrator (e.g. a switched capacitor integrator). In operation, the analogue processing stage 326 computes the difference of the desired baseline reference voltage $V_{bl,ref}$ and the amplifier output $V_{sha}$ (i.e. the sampled baseline error), weights it by some factor, and adds it to what was already summed up before (if allowed to do so by controller when exe=1). For example, if $V_{bl,ref}$=500 mV and $V_{sha}$=505 mV (i.e. error is +5 mV) and the voltage already stored in the analogue processing stage 326 was +123 mV and a weighting (gain) of 0.2 is implemented, then the output voltage of the analogue processing stage 326 would change from +123 mV to +124 mV (=+123 mV+0.2*(505 mV-500 mV)) for this period. This way, the resulting compensation current $I_{blr}$ would move a little bit towards a better compensation, trying to reduce the baseline error. The signs in the regulation loop are relevant: the positive error must cause a change in the direction towards less error (lower $V_{sha}$), which can be either by the amplifier (104) having a negative phase as shown FIG. 1, or by the baseline restorer circuit being inverted (not shown in the Figures).

The transconductance stage 328 is arranged to receive the output voltage from the analogue processing stage 326 and convert the output voltage to a compensation current $I_{blr}$. Thus the transconductance stage 328 can be considered as a voltage to current converter. The transconductance stage 328 is arranged to supply the compensation current to an input of a front-end circuit stage 104 of a photon counting circuit e.g. to an an input of the amplifier 106.

The functionality of the controller 324 described herein may be implemented in code (software) stored on a memory comprising one or more storage media, and arranged for execution on a processor comprising on or more processing units. The code is configured so as when fetched from the memory and executed on the processor to perform operations in line with embodiments discussed below. Alternatively it is not excluded that some or all of the functionality of the controller 324 is implemented in dedicated hardware circuitry, or configurable hardware circuitry like an FPGA.

As noted above, the baseline restorer circuit 300 may also comprise a comparator 312. The comparator 312 is arranged to receive the sample of the input voltage signal $V_{sha}$ from the sample-and-hold stage 302. The comparator 312 may be further arranged to receive a sample of the desired baseline reference voltage $V_{bl,ref}$ from the sample-and-hold stage 302 or may receive the desired baseline reference voltage $V_{bl,ref}$ as a continuous non-sampled input. The comparator 312 is configured to supply an output signal (inw) to the controller 324, the output signal (inw) indicating whether the sample of the input voltage signal $V_{sha}$ is within an acceptable range of the desired baseline reference voltage $V_{bl,ref}$.

The comparator 312 is configured to determine a differential voltage value (x) by determining the difference between the sample of the input voltage signal $V_{sha}$ and the desired baseline reference voltage $V_{bl,ref}$.

The comparator 312 shown in FIG. 3 is a window comparator in that it is configured to determine whether the differential voltage value (x) is within a voltage range defined by V3≤X≤V4.

If the differential voltage value (x) is within the voltage range defined by the window comparator 312 e.g. that the differential voltage value (x) is greater than a third negative predetermined threshold voltage V3 (e.g. −5 mV) and is less than a second positive predetermined threshold voltage (e.g. +5 mV), then the window comparator 312 determines that the input voltage signal $V_{sha}$ is within an acceptable range of the desired baseline reference voltage $V_{bl,ref}$. In this scenario, the comparator 312 outputs the output signal (inw) having a high (e.g. logic 1) value to the controller 324.

If the differential voltage value (x) is outside the voltage range defined by the window comparator 312 e.g. that the differential voltage value (x) is less than the third negative predetermined threshold voltage V3 (e.g. −5 mV) or is more than a second positive predetermined threshold voltage (e.g. +5 mV), then the window comparator 312 determines that the input voltage signal $V_{sha}$ is outside of the acceptable range of the desired baseline reference voltage $V_{bl,ref}$. In this scenario, the comparator 312 outputs the output signal (inw) having a low (e.g. logic 0) value to the controller 324.

Whilst the comparator 312 shown in FIG. 3 is a window comparator, in other implementations the comparator 312 is sensitive only in one direction.

In embodiments whereby the baseline restorer circuit 300 comprises the comparator 312, the value of the control signal (exe) is dependent on both the output signal (chg) received from the change detector stage 314 and the output signal (inw) received from the comparator 312.

In these embodiments, the controller 324 is configured to supply the control signal (exe) having a high (e.g. logic 1) value to allow processing of the sample of the input voltage signal $V_{sha}$ only when the controller 324 receives (i) a low output signal (chg) (e.g. logic 0) from the change detector stage 314 indicating that the input voltage signal $V_{sha}$ has not changed during a time interval around the sampling time of the input voltage signal $V_{sha}$ performed by the sample-and-hold stage 302, and (ii) a high output signal (inw) (e.g. logic 1) from the comparator 312.

In embodiments whereby both the comparator 320 and the comparator 312 are window comparators, V1 &V2 of the comparator 320 may be selected to provide a wider (larger) range than the values of V3&V4 associated with the comparator 312 because it is easier to do an accurate comparison with the sampled window comparator which just receives one constant input to process, while the change detector stage 314 has to quickly react on fast changes of the input voltage signal $V_{sha}$ which is a more expensive operation. Therefore, for a given overall baseline extraction performance, it may be preferable to have the change detector stage 314 less accurate and the sampled window comparator 312 more accurate.

Whilst FIG. 3 illustrates a single sample-and-hold stage 302, in other implementations the baseline restorer circuit 300 comprises two sample-and-hold stages operating in parallel. That is a first sample-and-hold stage 302 feeds the analogue processing stage 326 and a further sample-and-hold stage 302 feeds the comparator. The two sample-and-hold stages both receive the control signal (sh) from the controller 324 and thus operate with the same sample of the input voltage signal $V_{sha}$. The two sample-and-hold stages can be incorporated into a switched capacitor network which uses the charge stored in the sampling capacitors directly rather than just sensing their voltage through a high impedance input. In such a configuration, the charge is consumed and can only be used by one circuit (either the analogue processing stage 326 or the comparator 312), i.e. using the charge usually resets the capacitor and leaves nothing for a second circuit.

In the embodiments described herein, the controller 324 may be operable to enter a "recovery mode" which is activated if a defined number of samples of the input voltage signal $V_{sha}$ had to be discarded only due to the comparator 312 i.e. inw=0 (while the change detector would have released them). In the recovery mode, the controller 324 is configured to ignore the output signal (inw) of the comparator 312, such that the processing of further samples depends only on the output signal (chg) received from the change detector stage 314. This way, a large but constant $V_{sha}$ error can pass through and is regulated away, allowing the system to recover from an unexpected charge event or at startup. In the recovery mode, the controller 324 continues to receive the digital signal inw from the comparator 312, even though it does not use it to decide if a sample has to be discarded during recovery mode. The controller 324 is configured to exit the recovery mode if the comparator 312 reports a low baseline error again. That is, when operating in the recovery mode the controller 324 uses the output signal (inw) of the comparator 312 to observe if the samples have returned to within the target error range, for example by waiting for a predetermined number of samples in a row which fall into the target error range, indicated by the output signal (inw) having a high (e.g. logic 1) value from the comparator 312.

Figure 4:
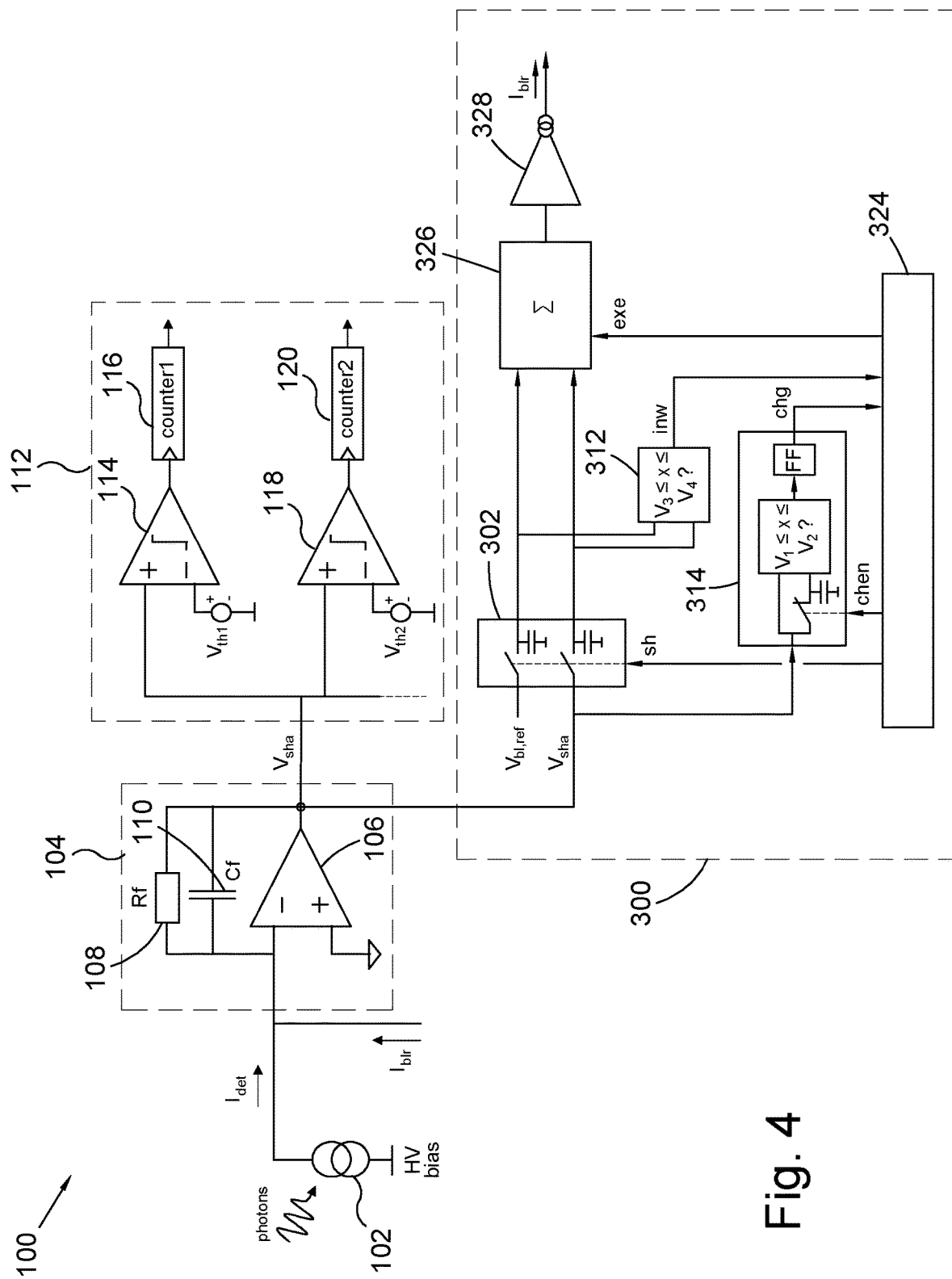
FIG. 4 illustrates a photon counting circuit including the baseline restorer circuit shown in FIG. 3.

FIG. 4 illustrates using the baseline restorer circuit 300 in a photon counting circuit 100.

Referring to FIG. 4, the photon counting circuit 100 comprises a photon detector 102 having a photon sensitive area. The photon detector 102 is configured to generate a current signal $I_{det}$ in dependence on an impact of a photon on the photon sensitive area. The photon counting circuit 100 comprises a front-end circuit stage 104 to receive the current signal $I_{det}$ from the photon detector 102 and to provide the voltage signal $V_{sha}$ (the baseline signal $V_{bl}+\Delta V$) in response to the current signal. The front-end circuit stage 104 comprises a charge sensitive amplifier (CSA) 106. The inverting input of the CSA 106 receives the current signal $I_{det}$. A feedback capacitor 110 may be connected between the inverting input of the CSA 106 and the output of the CSA 106. A feedback resistor 108 may be connected between the inverting input of the CSA 106 and the output of the CSA 106. The front-end circuit stage 104 senses charge at its input and shapes a voltage at its output to produce bell-shaped pulses. The front-end circuit stage 104 may comprise an inverting current buffer stage (not shown), to receive the $I_{det}$ current signal and feed into the amplifier 106.

The photon counting circuit 100 comprises an energy discriminator 112 being connected to the front-end circuit stage 104. In particular, the front-end circuit stage 104 provides the voltage signal $V_{sha}$ to the energy discriminator 112.

The energy discriminator 112 is configured to generate a digital signal in dependence on a comparison of a level of the voltage signal $V_{sha}$ with at least one threshold value Vth1, . . . , Vthn. In particular, the energy discriminator 112 may comprise several comparators 114,118 with different thresholds Vth1, . . . , VthN−1, VthN. The output signals of the comparators 114,118 are then individually counted by counters 116,120. It will be appreciated that the energy discriminator 112 may comprise any number of comparators (each with an associated counter).

As shown in FIG. 4, the baseline restorer circuit 300 receives the voltage signal $V_{sha}$ that is output from the front-end circuit stage 104. The baseline restorer circuit 300 may receive the voltage signal $V_{sha}$ directly from the CSA 106. The baseline restorer circuit 300 may receive the voltage signal $V_{sha}$ indirectly from the CSA 106. That is, after being output by the CSA 106, the voltage signal $V_{sha}$ may pass through one or more further components of the front-end circuit stage 104 (not shown in FIG. 4) e.g. a shaping amplifier stage, before being supplied to the baseline restorer circuit 300.

As shown in FIG. 4, the transconductance stage 328 is arranged to supply the compensation current $I_{blr}$ to an input of the front-end circuit stage 104. As shown in FIG. 4, the output of the transconductance stage 328 is coupled to the inverting input of the CSA 106.

The photon counting circuit 100 may be used for various photon counting applications, especially those which require low noise intensity measurements and possibly also spectral information. This includes medical imaging, spectroscopy, security scanners, computed tomography, etc.

Figure 5:
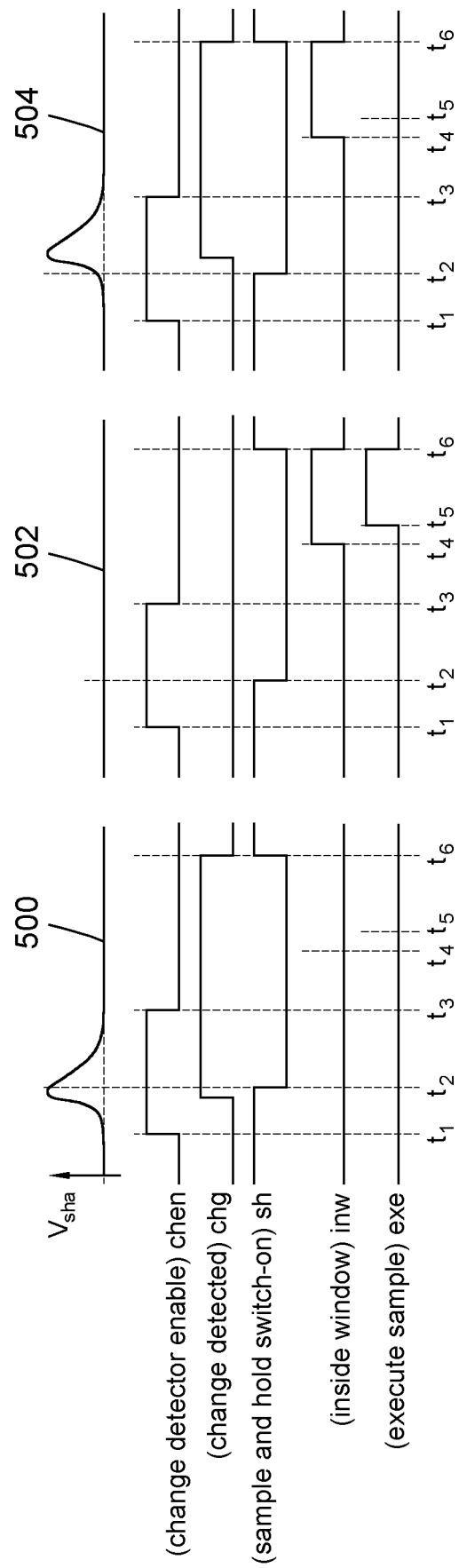
FIG. 5 shows example timing diagrams for the baseline restorer circuit shown in FIG. 3.

FIG. 5 shows three example timing diagrams to illustrate the operation of the baseline restorer circuit 300 shown in FIG. 3. In FIG. 5, the time $t_1$ corresponds to when the change detector stage 314 captures (freezes, memorizes) the instantaneous value of the voltage signal $V_{sha}$ in response to receiving the control signal (chen) from the controller 324, and starts to compare the continuous (non-sampled) input voltage signal $V_{sha}$ against this reference. The time $t_2$ corresponds to the point in time when the sample-and-hold stage 302 captures a sample of the input voltage signal $V_{sha}$ (sampling instant) in response to receiving the control signal (sh) from the controller 324, and the window comparator 312 starts to process it. The time $t_3$ corresponds to the end of the sensing period of the change detector stage 314. At time $t_4$ the result of the window comparator 312 is ready. The time $t_5$ corresponds to when the controller 324 is ready to flag to the analogue processing stage 326 if it can use the sample of the voltage signal $V_{sha}$. The time $t_6$ corresponds to the end of the sampling trial and the controller 324 is ready for the next sampling trial. A sampling trial corresponds to the time between the time $t_1$ and the time $t_6$, in that it comprises the capturing of a sample of the voltage signal $V_{sha}$, along with all the associated checks performed by the change detector stage 314 and comparator 312 for that sample.

Thus the interval between time $t_1$ and time $t_2$ corresponds to the monitoring period of the change detector stage 314 before the sample-and-hold stage 302 captures a sample of the input voltage signal $V_{sha}$. The interval between time $t_2$ and time $t_3$ corresponds to the monitoring period of the change detector stage 314 after the sample-and-hold stage 302 captures the sample of the input voltage signal $V_{sha}$. The interval between time $t_2$ and time $t_4$ corresponds to the decision time of the window comparator 312. The interval between time $t_4$ and time $t_5$ corresponds to the time the controller 324 takes to compute the final decision. The interval between time $t_5$ and time $t_6$ corresponds to the time the analogue processing stage 326 takes to use (usually integrate) the current sample of the input voltage signal $V_{sha}$ from the sample-and-hold stage 302.

FIG. 5 shows a first example of the sample-and-hold stage 302 sampling an input voltage signal $V_{sha}$500 (left-side waveform). In the first example, the sample-and-hold stage 302 samples right into a pulse at the input voltage signal $V_{sha}$ 500. Both the window comparator 312 and the change detector stage 314 recognize the pulse (inw stays low, chg goes high), and as a result the controller 324 discards the sample (exe stays low).

FIG. 5 shows a second example of the sample-and-hold stage 302 sampling an input voltage signal $V_{sha}$ 502 (central waveform). In the second example, no pulse is present around the sampling instant of the sample-and-hold stage 302. The window comparator 312 flags this by setting inw=1 after its decision time at time $t_4$, and the change detector stage 314 keeps the output signal (chg) low. As a result, the controller 324 brings the control signal (exe) high to allow processing of the sample.

FIG. 5 shows a third example of the sample-and-hold stage 302 sampling an input voltage signal $V_{sha}$504 (right-side waveform). In the third example, a pulse is occurring just after the sampling instant of the sample-and-hold stage 302, causing the sample-and-hold stage 302 to sample the onset of the pulse. The window comparator 312 does not recognize this small error (inw goes high), but the change detector stage 314 successfully recognizes the pulse, causing the controller 324 to discard the sample (exe stays low).

Figure 6:
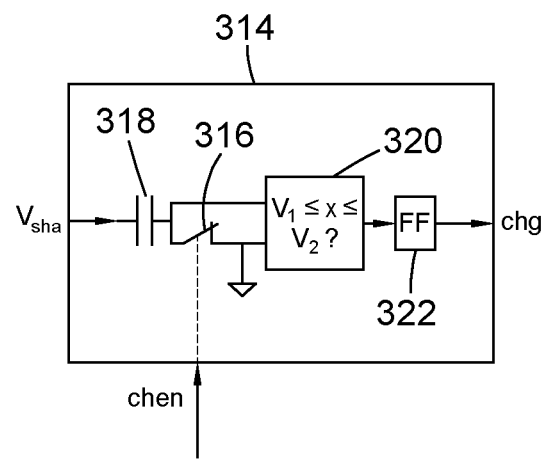
FIG. 6 shows an example implementation of a change detector using in the baseline restorer circuit shown in FIG. 3.

FIG. 6 shows a variant of the change detector stage 314, which has a different switch/capacitor configuration than the one shown in FIG. 3. In particular, the change detector stage 314 shown in FIG. 6 has the capacitor 318 at the input of the switch 316 so that it is arranged to continuously receive the input voltage signal $V_{sha}$. The change detector stage 314 shown in FIG. 6 follows the same operation as the change detector stage 314 shown in FIG. 3. In particular, as soon as the control signal chen (change detector enable) from the controller 324 goes high, the coarse window comparator 320 inside of the change detector monitors the input voltage signal $V_{sha}$ for changes compared to the voltage at the chen rising edge instant. Any such change in either direction during the monitoring period (chen=1 period) is memorized in the memory element 322. The AC coupling provided by the capacitor advantageously allows the further circuitry of the change detector stage 314 to operate at a different DC level than the input voltage signal $V_{sha}$.

Figure 7:
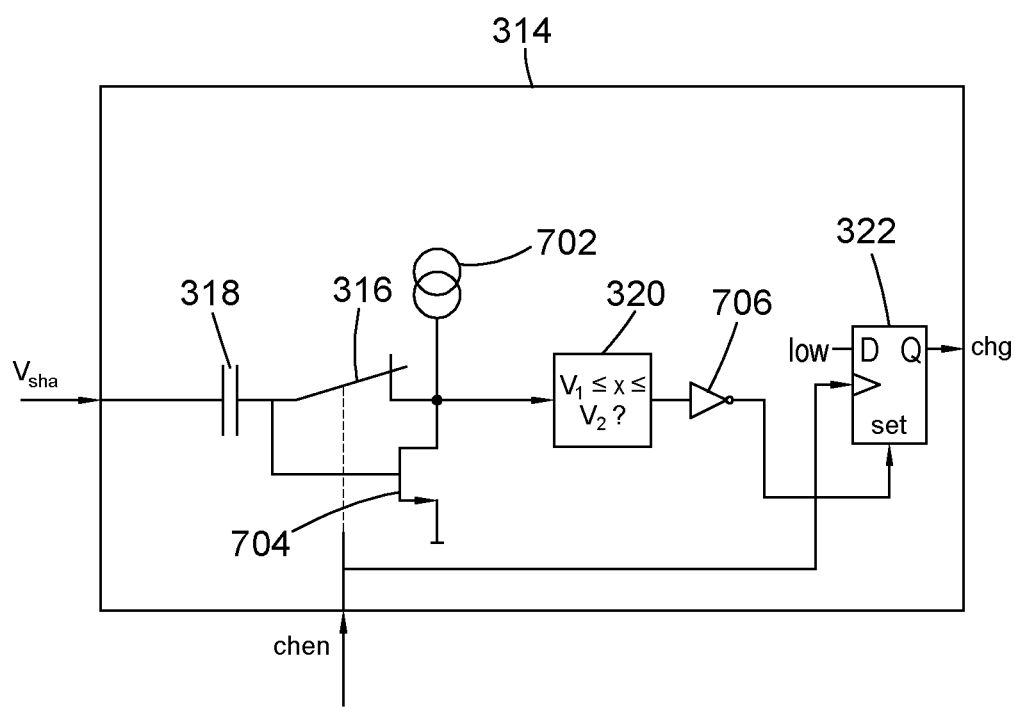
FIG. 7 shows another example implementation of a change detector using in the baseline restorer circuit shown in FIG. 3.

FIG. 7 shows a variant of the change detector stage 314 which uses the input capacitor 318 to also perform an auto-zero (AZ) operation of a gain stage comprised of a transistor 704 and a current source 702, to reduce offset in front of the coarse window comparator 320. The gain stage reduces the accuracy requirements of the coarse window comparator 320 by providing it with an amplified signal. The window comparator 320 is configured to derive a voltage difference x between its input voltage at the instant of switch 316 opening (chen rising edge) and its input voltage throughout the monitoring period (chen high), and compare this voltage difference against the thresholds V1 and V2. FIG. 7 also shows how a memory element 322 (e.g. a D-flipflop) can be used to memorize a detected change during the monitoring period: at the beginning of the monitoring period (chen rising edge) the D-flipflop 322 is initialized to a low state using its clock input and D input. Afterwards, a high signal at its set input is changing the state to high, and leaves it there. This way, even a short violation of the window comparator's thresholds is captured and memorized in the D-flipflop 322.

Whilst the comparator 320 in the change detector of FIGS. 6 and 7 may be a window comparator, in other implementations these change detector stages may comprises a comparator 320 that is sensitive only in one direction.

The change detector stage 314 described above performs dedicated monitoring of the input voltage signal $V_{sha}$. Additionally or alternatively, a change detector stage 802 shown in FIG. 8 may be used to check for changes in the input voltage signal $V_{sha}$. That is, in embodiments of the present disclosure a change detector comprises one or both of the change detector stage 314 and the change detector stage 802.

Figure 8:
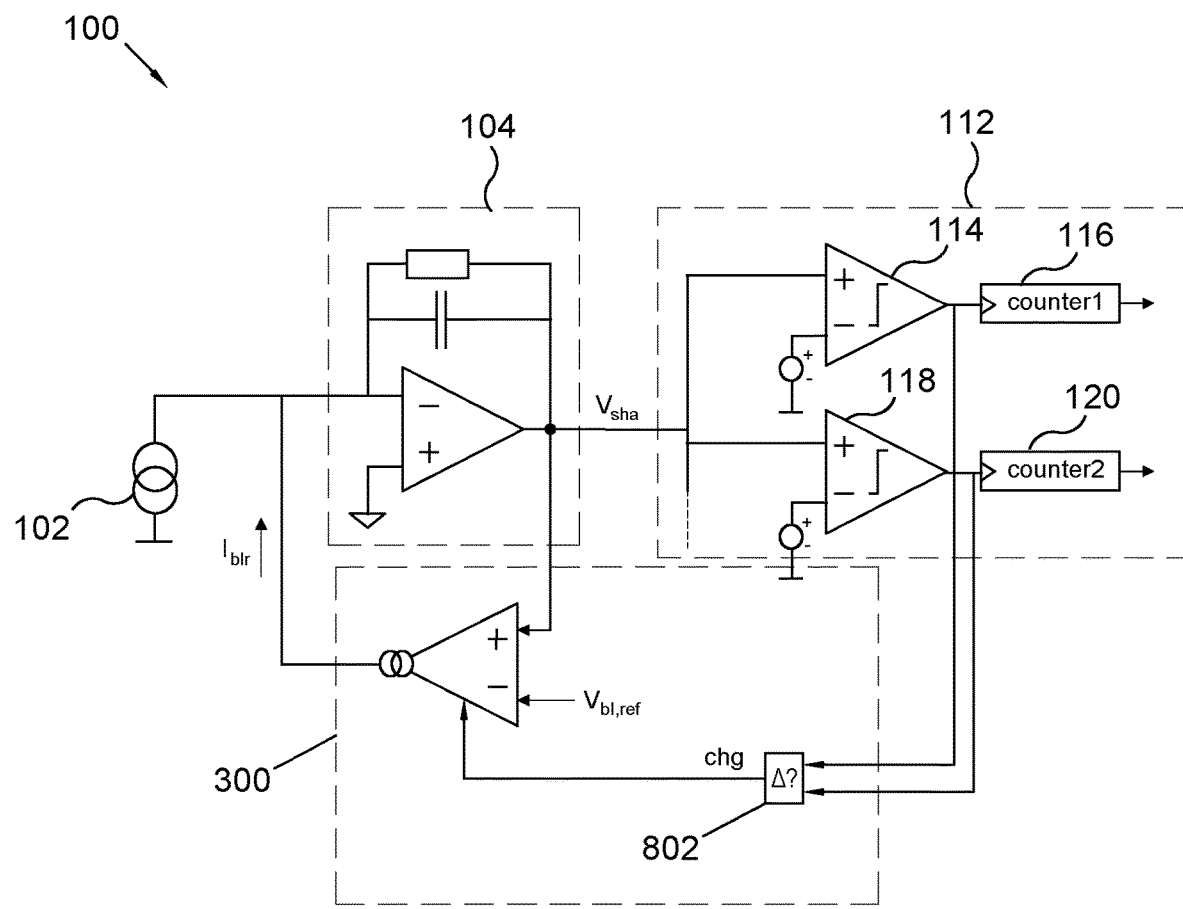
FIG. 8 illustrates a photon counting circuit including a baseline restorer circuit that monitors information from a pulse discriminator of the photon counting circuit.

The change detector stage 802 is illustrated in FIG. 8.

As shown in FIG. 8, the change detector stage 802 is arranged to receive a digital signal output from each of the comparators 114,118 of the energy discriminator 112 of the photon counting circuit 100, wherein each digital signal is generated by the energy discriminator 112 in dependence on a comparison of a level of the input voltage signal $V_{sha}$ with a threshold value. The change detector stage 802 is configured to monitor if the input voltage signal $V_{sha}$ changes during a time interval around the sampling time of the input voltage signal $V_{sha}$ performed by the sample-and-hold stage 302 based on the digital signal(s) received from the comparators 114,118.

If, during the monitoring period of the change detector stage 802 (corresponding to the time interval between $t_1$ and $t_3$ in FIG. 5), any of the pulse discriminator comparators changes state, then the change detector stage 802 considers this as a "change of $V_{sha}$ detected" condition and the change detector stage 802 supplies the output signal (chg) having a high (e.g. logic 1) value to the controller 324.

In the embodiments described above, to increasing the chance of finding a genuine baseline sample the baseline restorer circuit 300 can be replicated multiple times per detector pixel in order to increase the frequency of sampling the input voltage signal $V_{sha}$. That is, the same baseline restorer circuit can be replicated and driven with staggered time phases to perform staggered sensing (e.g. half the sampling trial time period apart from each other) of the input voltage signal $V_{sha}$.

In the embodiments described above, the sample repetition may be controlled by a clock signal to get a defined BLR loop regulation speed. That is, the controller 324 may be configured to control the baseline restorer circuit 300 to perform a predetermined number of sampling trials (e.g. 10) with one clock cycle. In these implementations, the controller 324 may be configured to transmit the control signal (exe) to the analogue processing stage 326 to control the analogue processing stage 326 to process a first valid sample of the input voltage signal $V_{sha}$ within the clock cycle but then deliberately ignores later valid samples within the same clock cycle. Thus the analogue processing stage 326 does not process every valid sample of the input voltage signal $V_{sha}$ within the clock cycle.

In the embodiments described above, the sampling may be re-triggered early with the aim of increasing the chance of finding a genuine baseline sample by sampling more often. In particular, as soon as the change detector finds a change indicated by the output signal (chg) having a high (e.g. logic 1) value, the controller 324 may be configured to not wait for the complete sampling trial to end and instead immediately commence a new sampling trial. That is, instead of waiting & executing until time t6,
a detected violation could cause the controller 324 to fast-forward to the next $t_1$ (with a time period where chen=0 in between, to reset the change detector).

Figure 9:
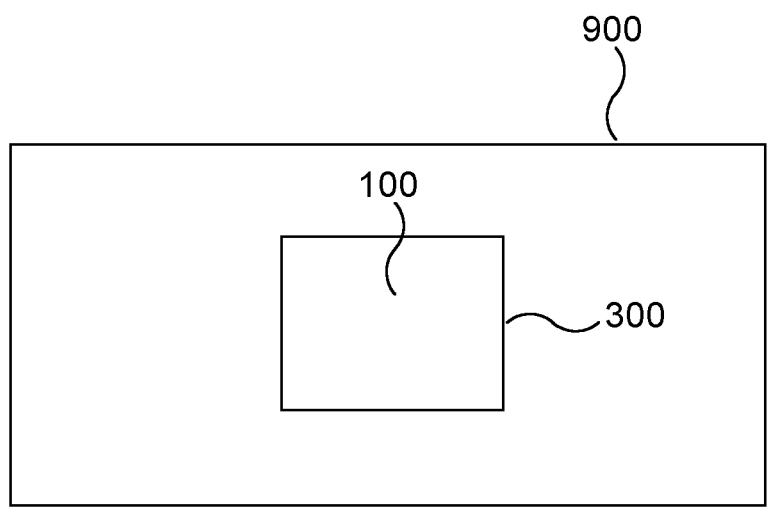
FIG. 9 is a schematic block diagram of a device for medical diagnostics.

FIG. 9 shows an example of an application where a photon counting circuit 100 comprising the baseline restorer circuit 300 according to an embodiment described herein is provided in a device 900 for medical diagnostics. The device 900 may be configured, for example, as an X-ray apparatus or a computed tomography scanner.

Although the disclosure has been described in terms of embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in any embodiments, whether alone or in any appropriate combination with any other feature disclosed or illustrated herein.

LIST OF REFERENCE NUMERALS 100 photon counting circuit
102 photon detector
104 front-end circuit stage
106 charge sensitive amplifier
108 feedback resistor
110 feedback capacitor
112 energy discriminator
114 comparator
116 counter
118 comparator
120 counter
122 baseline restorer circuit
200 curve of detector current $I_{det}$
250 curve of output voltage $V_{sha}$ of the front-end circuit stage
300 baseline restorer circuit
302 sample-and-hold stage
304 switch
306 capacitor
308 switch
310 capacitor
312 comparator
314 change detector stage
316 switch
318 capacitor
320 comparator
322 memory element
324 controller
326 analogue processing stage
328 transconductance stage
500 voltage signal $V_{sha}$
502 voltage signal $V_{sha}$
504 voltage signal $V_{sha}$
702 DC current source
704 switch
706 inverter
802 change detector stage
900 device

What is claimed is:

1. A baseline restorer circuit, the baseline restorer circuit comprising:
    a controller;
    a sample control circuit arranged to receive an input voltage signal that is output from a circuit stage comprising an amplifier, wherein the sample control circuit is configured to capture a sample of the input voltage signal at a sampling time in response to receiving a first control signal from the controller;
    an analogue processing stage arranged to receive the sample of the input voltage signal and a constant baseline reference voltage and selectively process the sample of the input voltage signal to provide an output voltage;

a transconductance stage configured to convert the output voltage to a compensation current and supply the compensation current to an input of the circuit stage; and a change detector configured to monitor if the input voltage signal changes during a time interval around the sampling time, and if no change is detected in the input voltage signal during the time interval, the controller is further configured to transmit a second control signal to the analogue processing stage to control the analogue processing stage to process the sample of the input voltage signal, wherein the change detector comprises a change detector stage arranged to continuously receive the input voltage signal, and wherein commencement and expiry of the time interval is controlled by the controller transmitting a third control signal to the change detector.

2. The baseline restorer circuit of claim 1, wherein at commencement of the time interval the change detector is configured to capture an instantaneous value of the input voltage signal and is configured to monitor if the input voltage signal changes during the time interval by comparing the input voltage signal to said instantaneous value of the input voltage signal.

3. The baseline restorer circuit of claim 2, wherein the change detector is configured to:
determine a voltage difference value based on said comparing; and
determine that the input voltage signal has changed during the time interval by at least one of:
detecting that the voltage difference value is less than a first negative predetermined threshold voltage; and
detecting that the voltage difference value is greater than a second positive predetermined threshold voltage.

4. The baseline restorer circuit of claim 1, wherein the change detector comprises a change detector stage arranged to receive a digital signal output from an energy discriminator, wherein the digital signal is generated by the energy discriminator in dependence on a comparison of a level of the input voltage signal with at least one threshold value, the change detector stage configured to monitor if the input voltage signal changes during a time interval around the sampling time based on the digital signal.

5. The baseline restorer circuit of claim 4, wherein the change detector stage is configured to determine that the input voltage signal has changed during the time interval by detecting a change of state of the digital signal.

6. The baseline restorer circuit of claim 1, wherein the change detector is arranged to supply an output signal to the controller, said output signal indicating whether the input voltage signal has changed during the time interval.

7. The baseline restorer circuit of claim 1, wherein if the change detector detects a change in the input voltage signal during the time interval, the controller is further configured to transmit the second control signal to the analogue processing stage to control the analogue processing stage to discard the sample of the input voltage signal.

8. A photon counting circuit, comprising:
the baseline restorer circuit according to claim 1;
a photon detector having a photon sensitive area, the photon detector being configured to generate a current signal in dependence on an impact of a photon on the photon sensitive area;

the circuit stage comprising the amplifier, the circuit stage arranged to receive the current signal and provide the input voltage signal in response to the current signal; and an energy discriminator being connected to the circuit stage, the energy discriminator being configured to generate a digital signal in dependence on a comparison of a level of the input voltage signal with at least one threshold value.

9. A device for medical diagnostics, comprising a photon counting circuitry of claim 8, wherein the device is configured as an X-ray apparatus or a computed tomography scanner.

10. A baseline restorer circuit, the baseline restorer circuit comprising:
a controller;
a sample control circuit arranged to receive an input voltage signal that is output from a circuit stage comprising an amplifier, wherein the sample control circuit is configured to capture a sample of the input voltage signal at a sampling time in response to receiving a first control signal from the controller;
an analogue processing stage arranged to receive the sample of the input voltage signal and a constant baseline reference voltage and selectively process the sample of the input voltage signal to provide an output voltage;
a transconductance stage configured to convert the output voltage to a compensation current and supply the compensation current to an input of the circuit stage; and
a change detector configured to monitor if the input voltage signal changes during a time interval around the sampling time, and if no change is detected in the input voltage signal during the time interval, the controller is further configured to transmit a second control signal to the analogue processing stage to control the analogue processing stage to process the sample of the input voltage signal,
wherein the change detector comprises a change detector stage arranged to receive a digital signal output from an energy discriminator, wherein the digital signal is generated by the energy discriminator in dependence on a comparison of a level of the input voltage signal with at least one threshold value, the change detector stage configured to monitor if the input voltage signal changes during a time interval around the sampling time based on the digital signal.

11. The baseline restorer circuit of claim 10, wherein the change detector stage is configured to determine that the input voltage signal has changed during the time interval by detecting a change of state of the digital signal.

12. The baseline restorer circuit of claim 11, wherein if the comparator determines that the sample of the input voltage signal is outside of the acceptable range of the constant baseline reference voltage, the controller is further configured to transmit the second control signal to the analogue processing stage to control the analogue processing stage to discard the sample of the input voltage signal.

13. The baseline restorer circuit of claim 12, wherein the controller is further configured to:
count a number of samples of the input voltage signal that are discarded only due to the fourth control signal output by the comparator; and
if the counted number of samples exceeds a threshold, enter an operating mode in which the controller processes further samples of the input voltage signal in dependence on only the output signal of the change detector.

14. The baseline restorer circuit of claim 13, wherein the controller is configured to exit said operating mode in response to the fourth control signal indicating that a predetermined number of samples of the input voltage signal are within the acceptable range of the constant baseline reference voltage.

15. The baseline restorer circuit of claim 11, wherein the sample of the input voltage signal received by the comparator is the sample of the input voltage signal captured by the sample control circuit.

16. The baseline restorer circuit of claim 11, wherein the sample of the input voltage signal received by the comparator is captured by a further sample control circuit, the further sample control circuit arranged to receive the input voltage signal that is output from the circuit stage.

17. The baseline restorer circuit of claim 11, wherein the sample control circuit is arranged to receive the constant baseline reference voltage and is configured to capture a sample of the constant baseline reference voltage, wherein the comparator is arranged to receive the sample of the constant baseline reference voltage.

18. The baseline restorer circuit of 16, wherein the further sample control circuit is arranged to receive the constant baseline reference voltage and is configured to capture a sample of the constant baseline reference voltage, wherein the comparator is arranged to receive the sample of the constant baseline reference voltage.

19. The baseline restorer circuit of claim 11, wherein the comparator is configured to determine that the sample of the input voltage signal is within an acceptable range of the constant baseline reference voltage by at least one of:
  detecting that the differential voltage value is greater than a third negative predetermined threshold voltage; and
  detecting that the differential voltage value is less than a fourth positive predetermined threshold voltage.

20. A baseline restorer circuit, the baseline restorer circuit comprising:
  a controller;
  a sample control circuit arranged to receive an input voltage signal that is output from a circuit stage comprising an amplifier, wherein the sample control circuit is configured to capture a sample of the input voltage signal at a sampling time in response to receiving a first control signal from the controller;
  an analogue processing stage arranged to receive the sample of the input voltage signal and a constant baseline reference voltage and selectively process the sample of the input voltage signal to provide an output voltage;
  a transconductance stage configured to convert the output voltage to a compensation current and supply the compensation current to an input of the circuit stage;
  a change detector configured to monitor if the input voltage signal changes during a time interval around the sampling time, and if no change is detected in the input voltage signal during the time interval, the controller is further configured to transmit a second control signal to the analogue processing stage to control the analogue processing stage to process the sample of the input voltage signal; and
  a comparator arranged to receive a sample of the input voltage signal and the constant baseline reference voltage, the comparator configured to:
    compare the sample of the input voltage signal to the constant baseline reference voltage to determine a differential voltage value; and
    determine, using the differential voltage value, whether the sample of the input voltage signal is within an acceptable range of the constant baseline reference voltage; and
    output a fourth control signal to the controller, the fourth control signal indicating whether the sample of the input voltage signal is within the acceptable range of the constant baseline reference voltage, wherein transmission of the second control signal to the analogue processing stage to control the analogue processing stage to process the sample of the input voltage signal is further based on the fourth control signal indicating that the sample of the input voltage signal is within the acceptable range of the constant baseline reference voltage.

* * * * *